United States Patent
Emma et al.

(10) Patent No.: US 9,373,557 B2
(45) Date of Patent: Jun. 21, 2016

(54) ENHANCED MODULARITY IN HETEROGENEOUS 3D STACKS

(75) Inventors: Philip G. Emma, Danbury, CT (US); Eren Kursun, Ossining, NY (US); Jude A. Rivers, Cortlandt Manor, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 937 days.

(21) Appl. No.: 13/535,675

(22) Filed: Jun. 28, 2012

(65) Prior Publication Data

US 2012/0272202 A1 Oct. 25, 2012

Related U.S. Application Data

(62) Division of application No. 12/774,223, filed on May 20, 2010, now Pat. No. 8,677,613.

(51) Int. Cl.
*G06F 17/50* (2006.01)
*H01L 23/14* (2006.01)
(Continued)

(52) U.S. Cl.
CPC ............. *H01L 23/147* (2013.01); *H01L 23/13* (2013.01); *H01L 23/5382* (2013.01);
(Continued)

(58) Field of Classification Search
CPC .................. H01L 2924/0002; H01L 2924/00; H01L 21/4803; H01L 2225/06575; H01L 2225/06589; H01L 23/13; H01L 23/147; H01L 23/5382; H01L 23/5389; H01L 25/0652; H01L 25/18; H01L 2924/15311; Y10T 29/49128; Y10T 29/4913; Y10T 29/49137; Y10T 29/49146
See application file for complete search history.

(56) References Cited

U.S. PATENT DOCUMENTS 5,397,921 A 3/1995 Karnezos
5,537,108 A 7/1996 Nathan et al.
(Continued)

FOREIGN PATENT DOCUMENTS

CN 101507379 A 8/2009
EP 0611129 A2 8/1994
(Continued)

OTHER PUBLICATIONS

U.S. Appl. No. 12/774,223; Notice of Allowance ; filed May 20, 2010; Date Mailed: Nov. 8, 2013; pp. 1-13.
(Continued)

*Primary Examiner* — Nha Nguyen
(74) *Attorney, Agent, or Firm* — Michael J. LeStrange, Esq.

(57) ABSTRACT

A method for generating and implementing a three-dimensional (3D) computer processing chip stack plan that includes receiving system requirements from a plurality of clients, identifying common processing structures and technologies from the system requirements, and assigning the common processing structures and technologies to a layer in the 3D computer processing chip stack plan. The method also includes identifying uncommon processing structures and technologies from the system requirements and assigning the uncommon processing structures and technologies to a host layer in the 3D computer processing chip stack plan. The method further includes determining placement and wiring of the uncommon structures on the host layer, storing placement information in the plan, and transmitting the plan to manufacturing equipment. The manufacturing equipment generates and integrates both the layer including the common structures and technologies and the host layer including the uncommon structures and technologies to form the 3D computer processing chip stack.

15 Claims, 6 Drawing Sheets

(51) Int. Cl.
*H05K 3/46* (2006.01)
*H01L 23/13* (2006.01)
*H01L 23/538* (2006.01)
*H01L 25/065* (2006.01)
*H01L 25/18* (2006.01)
*H05K 3/30* (2006.01)
*H01L 21/48* (2006.01)

(52) U.S. Cl.
CPC ....... *H01L 23/5389* (2013.01); *H01L 25/0652* (2013.01); *H01L 25/18* (2013.01); *H05K 3/465* (2013.01); *H01L 21/4803* (2013.01); *H01L 2225/06575* (2013.01); *H01L 2225/06589* (2013.01); *H01L 2924/0002* (2013.01); *H01L 2924/15311* (2013.01); *H05K 3/30* (2013.01); *Y10T 29/4913* (2015.01); *Y10T 29/49128* (2015.01); *Y10T 29/49137* (2015.01); *Y10T 29/49146* (2015.01)

(56) References Cited

U.S. PATENT DOCUMENTS

| | | | |
|---|---|---|---|
| 5,999,440 A | 12/1999 | Crafts | |
| 6,052,287 A | 4/2000 | Palmer et al. | |
| 6,236,115 B1 | 5/2001 | Gaynes et al. | |
| 6,333,553 B1 | 12/2001 | Pogge | |
| 6,376,909 B1 | 4/2002 | Forbes et al. | |
| 6,823,499 B1* | 11/2004 | Vasishta | G06F 17/5068 716/115 |
| 6,908,561 B1 | 6/2005 | Foust et al. | |
| 7,262,082 B1* | 8/2007 | Lin | H01L 21/6835 257/698 |
| 2002/0156929 A1 | 10/2002 | Hekmatpour | |
| 2005/0077596 A1 | 4/2005 | Bauer et al. | |
| 2007/0035015 A1 | 2/2007 | Hsu | |
| 2007/0240092 A1* | 10/2007 | Lee | H01L 25/18 438/129 |
| 2008/0116545 A1* | 5/2008 | Grinman | H01L 21/561 257/660 |
| 2008/0122057 A1 | 5/2008 | Webb | |
| 2009/0039523 A1 | 2/2009 | Jiang et al. | |
| 2009/0200650 A1 | 8/2009 | Tan | |
| 2009/0215231 A1 | 8/2009 | Inoue | |

FOREIGN PATENT DOCUMENTS

| | | |
|---|---|---|
| JP | H06334113 A | 12/1994 |
| JP | 08162604 A | 6/1996 |
| JP | H10303364 A | 11/1998 |
| JP | 2001127240 A | 5/2001 |
| JP | 2007019454 A | 1/2007 |
| JP | 2008251666 A | 10/2008 |
| JP | 2008294475 A | 12/2008 |

OTHER PUBLICATIONS

Examination Report for Great Britain Application No. GB1221491.2, Mailed Nov. 19, 2013, 4 pages.
German Office Action, Mailed Dec. 2, 2013, 8 pages.
Examination Report Reply for Great Britain Application No. GB1221491.2, Mailed Jan. 20, 2014; 3 pages.
Chirag S. Patel; "Silicon Carrier for Computer Systems"; IBM T.J. Watson Research Center; Annual ACM IEEE Design Automation Conference Proceedings of the 43rd Annual Design Automation Conference; Publication: 2006; pp. 857-862; ISBN 1-59593-381-6.
PCT/US11/34097—PCT Search Report dated Jul. 11, 2011.
PCT/US11/34097—Written Opinion dated Jul. 11, 2011.
U.S. Appl. No. 13/535,660; Non-Final Office Action; filed Jun. 28, 2012; Date Mailed: Jan. 12, 2016.
U.S. Appl. No. 13/535,694; Non-Final Office Action; filed Jun. 28, 2012; Date Mailed: Dec. 4, 2015; 50 pages.

\* cited by examiner

ENHANCED MODULARITY IN HETEROGENEOUS 3D STACKS

CROSS-REFERENCE TO RELATED APPLICATION

This application is a Divisional of U.S. patent application Ser. No. 12/774,223, filed May 20, 2010, the disclosure of which is incorporated by reference herein in its entirety.

BACKGROUND

This invention relates generally to processing within a computing environment, and more particularly to enhancing modularity in heterogeneous 3D stacks.

In computer chip manufacturing, three-dimensional (3D) stacks use layers of components, such as processing chips and memory that are combined in a way that decreases the distance that data must travel between the components. The decreased distance between components results in faster data rates and lower heat as a result of less electrical resistance.

Modularity and heterogeneous integration are important advantages of 3D technology, yet they are limited to same size chips. In the case of heterogeneous chip sizes, efficient use of silicon in chip layers containing accelerator chips or redundancy layers is challenging since these layers tend to be smaller than the main processor chip itself. Integrating chips which are smaller than the main processor chip results in either the use of silicon as a filler to extend the chips to the same dimensions as the main processor, or results in air gaps in the layers which contain the smaller chips. Using extra silicon is inefficient, and leaving air space creates uneven heat dissipation resulting in hot spots on the chips. However, integrating smaller and less complicated layers, such as accelerators/redundancies, has clear yield and cost advantages, because chip size and complexity are major determinants of yield. The thermal interface material between the silicon layers and the lid, or heat sync, may not have full coverage if the smaller chips are placed between the heat sync and main processor. In addition, aligning these smaller chips can present issues, as the underlying main processor, which is typically much larger than these smaller chips, does not easily lend itself to layer alignment procedures with chips of varying sizes.

BRIEF SUMMARY

An exemplary embodiment includes a method for generating and implementing a three-dimensional (3D) computer processing chip stack plan. The method includes receiving system requirements from a plurality of clients, identifying common processing structures and technologies from the system requirements, and assigning the common processing structures and technologies to a layer in the 3D computer processing chip stack plan. The common processing structures and technologies specify properties of processing structures and technologies that are common to a defined quantity of the clients. The method also includes identifying uncommon processing structures and technologies from the system requirements and assigning the uncommon processing structures and technologies to a host layer in the 3D computer processing chip stack plan. The uncommon processing structures and technologies specify properties of processing structures and technologies that have no commonality with a defined quantity of the clients. The method also includes determining placement and wiring of the uncommon structures on the host layer, and storing placement information in the plan and transmitting the plan to manufacturing equipment. The manufacturing equipment generates both the layer including the common structures and technologies and the host layer including the uncommon structures and technologies. The manufacturing equipment also integrates the host layer and the other layer according to assignments and the placement information to form the 3D computer processing chip stack Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

An exemplary embodiment of the present invention provides for enhanced three-dimensional (3D) computer processing chip stacks. The exemplary 3D computer processing chip stacks provide improved design modularity and accommodate heterogeneity of integrated layers employed in the 3D computer processing chip stacks.

Figure 1A:
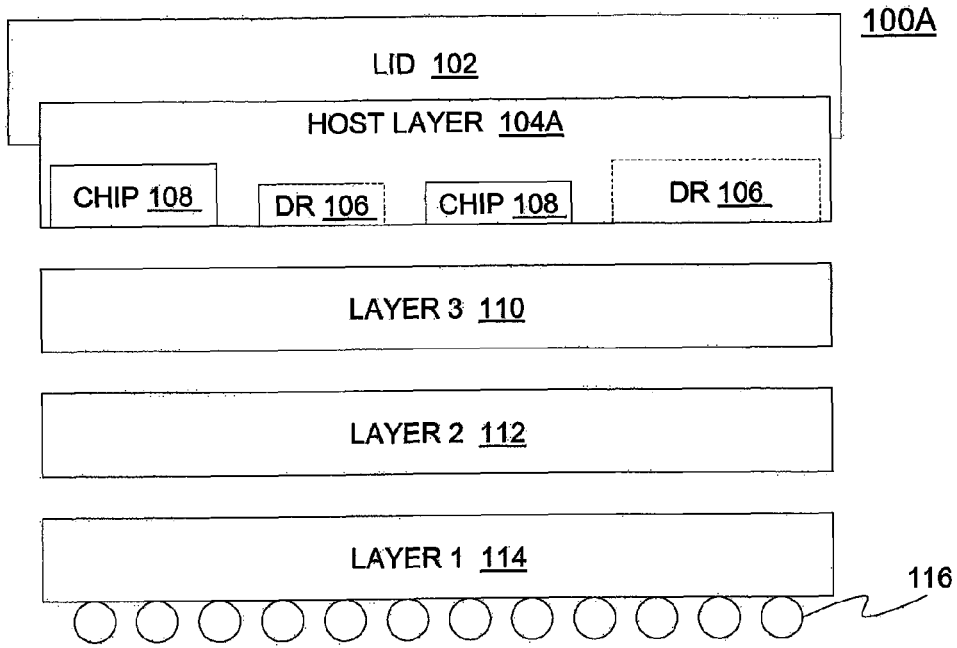
FIG. 1A depicts a block diagram of a side view of a three-dimensional computer processing chip stack in accordance with an exemplary embodiment.
Figure 1B:
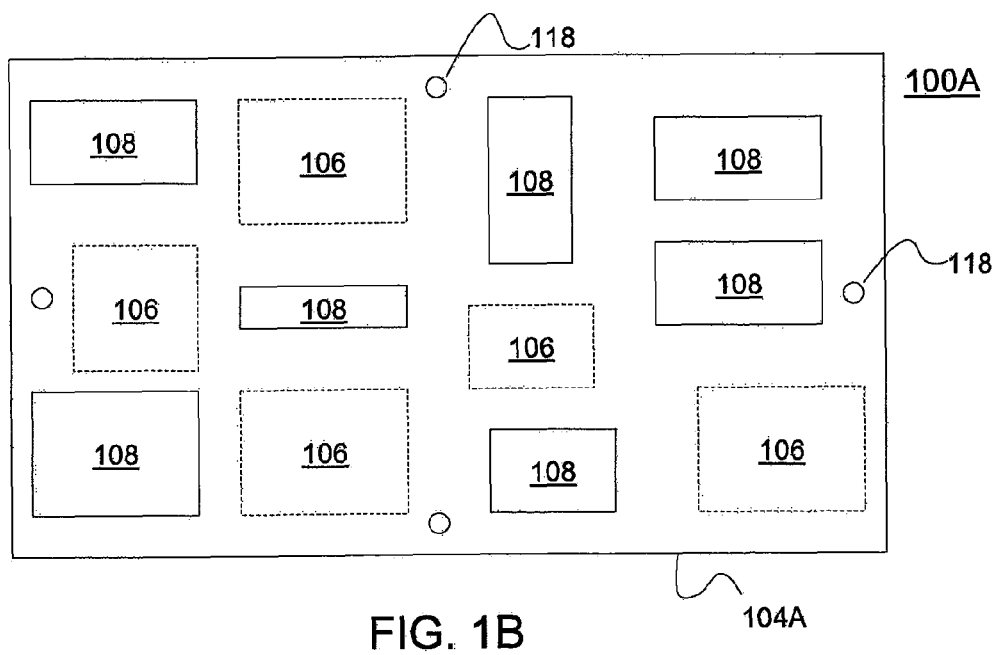
FIG. 1B depicts a block diagram of a top view of the three-dimensional computer processing chip stack of FIG. 1A in accordance with an exemplary embodiment.

Turning now to FIGS. 1A and 1B, a side view and a top view, respectively, of an exemplary 3D computer processing chip stack 100A will now be described. The 3D computer processing chip stack 100A refers to a system of integrated circuit chips and includes a plurality of layers (e.g., layers 110, 112, and 114). The layers 110, 112, and 114 may be formed of semiconductor material and include various components or structures, such as logic, memory, and core processors. The layers 110, 112, and 114 are integrated (e.g., stacked) to form a portion of the 3D computer processing chip stack 100A. For example, layer 112 may be disposed on layer 114, and layer 110 may be disposed on layer 112. While the three layers 110, 112, and 114 are illustrated in FIG. 1 as forming part of the 3D computer processing chip stack 100A, it will be understood that additional (or fewer) layers may be employed in order to realize the advantages of the exemplary embodiments.

In an exemplary embodiment, the 3D computer processing chip stack 100A also includes a host layer 104A (also referred to herein as "carrier layer") on which dedicated regions 106 are formed for receiving a number of chips 108. These chips 108 (also referred to herein as "chiplets") may be defined as subsystems of a microprocessor core that are modularized such that multiple variations of cores can be configured from selected groupings of these chiplets to produce customized functions. As shown in FIG. 1B, for illustrative purposes the host layer 104A includes seven chips 108. It will be understood, however, that additional (or fewer) chips 108 may be employed in order to realize the advantages of the exemplary embodiments.

In an exemplary embodiment, each of the chips 108 includes a dedicated power supply and a dedicated clock grid, such that each operates independently of the others. In one exemplary embodiment, the chips 108 support various voltage supplies and clock grids and need not be compatible with one another (e.g., where power and clock distribution networks and operating specifications are incompatible with other chips). Once integrated with the stack 100A, the chips 108 are communicatively coupled to the layers 110, 112, and 114, e.g., via wiring or wire mesh. However, the chips 108 are not electrically connected to the host layer 104A. Rather, the 3D computer processing chip stack 100A also includes programmable connections, such as the wiring grid (not shown), which enable the chips 108 to communicate with other layers 110, 112, and 114 of the 3D processing chip stack 100A. In an exemplary embodiment, each of the chips 108 may be communicatively coupled to other components in any of the layers 110, 112, and 114.

A variety of types of the chips 108 may be manufactured such that at least one of the chips 108 disposed on the host layer 104A have properties that are different from those of others of the chips 108. These heterogeneous properties may include, e.g., variations in chip size, variations in sizes, aspect ratios, thicknesses, operating point specs (e.g., clock frequency, supply voltage), number and characteristics of wiring layers, and the use of disparate technologies. Examples of disparate technologies employed by the chips 108 may include e.g., 22, 32, and 45 nanometer (nm) chips. The chips 108 may be configured for various functions (e.g., the chips 108 may be cache chips, floating point accelerators, encryption and decryption accelerators, or any other type of computer chip as is known in the art).

The dedicated regions 106 may be formed on the host layer 104A by etching the host layer 104A to create openings, or cavities, of a size sufficient to accommodate particular chips sizes and thicknesses. The dimensions of the etching (e.g., length, width, and depth) on the host layer 104A correspond to the dimensions of the length, width, and thickness of the desired chips 108. In addition, the host layer 104A may be etched to form etch stops to create borders for the dedicated regions 106.

In an exemplary embodiment, the host layer 104A may be constructed of a thermally conductive material (e.g., silicon) in order to provide increased cooling for the chips 108, as well as the underlying layers 110, 112, and 114. Heat dissipation of the 3D computer processing chip stack 100A may be improved due to the use of the thermally conductive material. The chips 108 are not electrically connected to the host layer 104A (e.g., they are instead communicatively coupled to other layers 110, 112, and 114 via programmable wiring or a wire mesh that is provided on the host layer 104A after the chips 108 have been integrated onto the host layer 104A.

In addition, the host layer 104A may include infrastructure or material (not shown) to improve the thermal conductivity (e.g., Cu thermal vias, embedded cooling channels, metal mesh structures, and specialized interface materials to improve the heat conduction from the chips 108 and other stack elements to the lid 102), whereby chips 108 disposed on the host layer 104A provide even contact with the infrastructure or material due to the thermally conductive material used in constructing the host layer 104A, thereby improving thermal conductivity of the 3D computer processing chip stack 100A. The chips 108 disposed on the host layer 104A are joined to respective surfaces of their corresponding dedicated regions 106 through the application of this infrastructure to the host layer 104A, thereby forming a monolithic element with respect to the host layer 104A and chips 108. The monolithic aspects provide a smooth seamless surface, as depicted in the exemplary host layer 104A of FIG. 1A.

In alternative embodiments, the host layer 104A (having the thermally conductive material and/or embedded metal structures to enhance the thermal conductivity) may be used without any chips 108 to provide cooling and/or shielding with respect to the underlying layers 110, 112, and 114. The shielding properties of the host layer 104A material (e.g., via mesh structures) protect against alpha rays that may otherwise cause interference.

Also included in the 3D computer processing chip stack 100A is a lid 102, which may be a heat sync for use in facilitating the dissipation of heat generated by the layers 104A, 110, 112, and 114. The lid 102 may be disposed on top of the host layer 104A, e.g., as shown in FIG. 1A.

The 3D computer processing chip stack 100A may also include connection pins 116 (FIG. 1A) which serve to connect the 3D computer processing chip stack 100A to a hardware device (not shown) within which it will operate.

As shown in FIG. 1B, the host layer 104A further includes alignment marks 118. The alignment marks 118 assist in aligning the host layer 104A with the other layers 110, 112, and 114. In exemplary embodiment the alignment marks 118 are used to integrate the layers 104A, 110, 112, and 114 using laser alignment, or other alignment techniques as will be understood by those skilled in the art.

During integration of the host layer 104A with the other layers 110, 112, and 114, the host layer 104A is disposed on the other layers 110, 112, and 114 (which layers 110, 112, and 114 are vertically stacked as shown in FIG. 1A). The layers 110, 112, and 114 each include alignment holes corresponding to the placement of the alignment markings 118 of the host layer 104A. The alignment of the layers 104A, 110, 112, and 114 may be checked by pointing a laser beam through the alignment marks 118. If the laser beam completes its path through all of the layers 104A, 110, 112, and 114, the 3D processing chip stack 100A is successfully aligned. Because the chips 108 are mounted to the host layer 104A, once the host layer 104A is aligned with the other layers 110, 112, and 114, the chips 108 will be properly aligned as well.

Figure 1C:
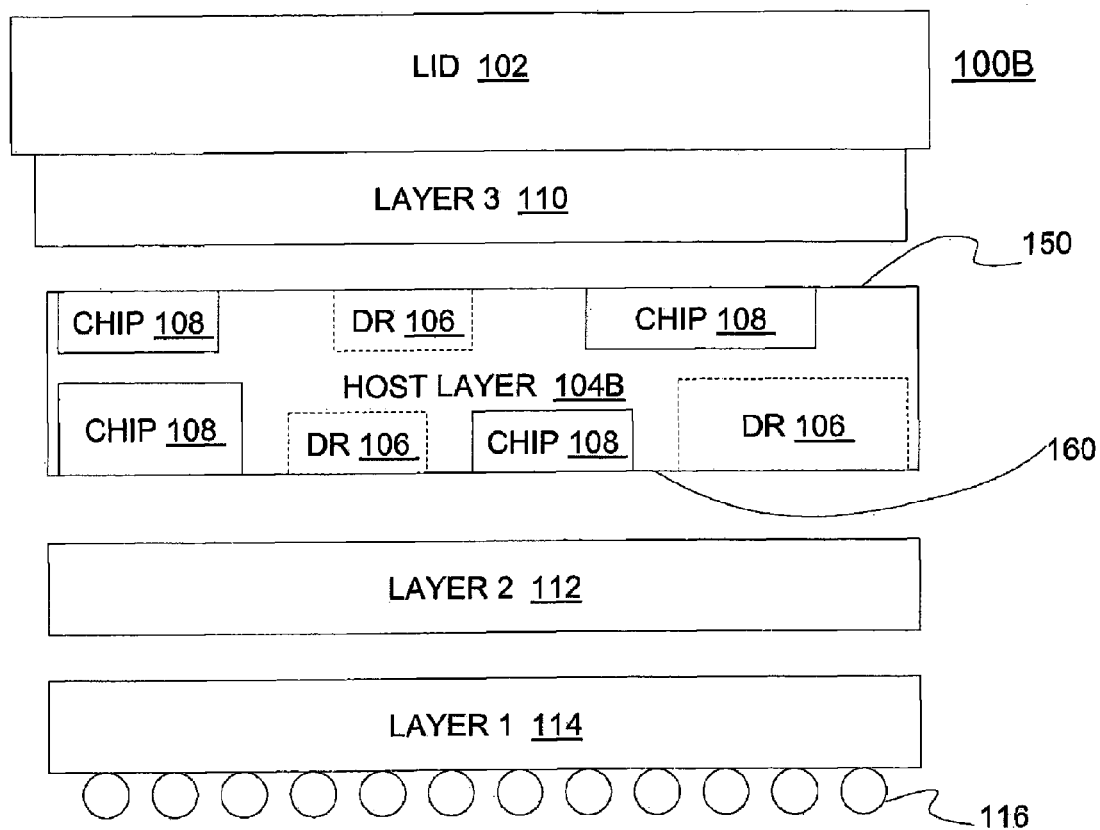
FIG. 1C depicts a block diagram of a side view of a three-dimensional computer processing chip stack in accordance with an alternative exemplary embodiment.

Turning now to FIG. 1C, a side view of a 3D computer processing chip stack 100B will now be described. The 3D computer processing chip stack 100B may include many of the elements described above in FIG. 1A. To the extent these elements overlap, they will not be further described herein. The exemplary host layer 100B refers to a system of integrated circuit chips and includes a plurality of layers (denoted as layers 110-114). These layers may include structures and material similar to those described above in FIG. 1A. The layers 110-114 are integrated (e.g., stacked) to form a portion of the 3D computer processing chip stack 100B. In the exemplary embodiment shown in FIG. 1C, e.g., layer 112 may be disposed on layer 114, the host layer 104B may be disposed on layer 112, and layer 110 may be disposed on the host layer 104B.

In an exemplary embodiment, the host layer 104B includes a first planar side 160 (also referred to as a bottom portion) and a second planar side 150 (also referred to as a top portion) upon both of which dedicated regions 106 are formed for receiving a number of chips 108. The first planar side 160 and the second planar side 150 are horizontally disposed on opposing sides of each other with respect to the host layer 104B. The chips 108 are described fully in FIG. 1A and will not be further described herein. Using the same or similar etching techniques described above, the dedicated cavities 106 may be formed on both planar sides (i.e., upper and lower portions 150 and 160) of the host layer 104B as depicted, e.g., in FIG. 1C. Once integrated with the stack 100B, the chips 108 are communicatively coupled to the layers 110-114, e.g., via wiring or wire mesh. Additionally, as described above in FIG. 1A, the chips 108 of the host layer 104B are not electrically connected to the host layer 104B. Rather, the 3D computer processing chip stack 100B also includes programmable connections, such as the wiring grid (not shown), which enable the chips 108 to communicate with other layers 110-114 of the 3D processing chip stack 100B. In an exemplary embodiment, each of the chips 108 may be communicatively coupled to other components in any of the layers 110, 112, and 114.

A variety of types of the chips 108 may be manufactured such that at least one of the chips 108 disposed on the host layer 104B have properties that are different from those of others of the chips 108. These heterogeneous properties may include, e.g., variations in chip size, variations in sizes, aspect ratios, thicknesses, operating point specs (e.g., clock frequency, supply voltage), number and characteristics of wiring layers, and the use of disparate technologies. The dedicated regions 106 may be formed on the host layer 104B by etching the host layer 104B to create openings, or cavities, of a size sufficient to accommodate particular chips sizes and thicknesses. The dimensions of the etching (e.g., length, width, and depth) on the host layer 104B correspond to the dimensions of the length, width, and thickness of the desired chips 108. In addition, the host layer 104 may be etched to form etch stops to create borders for the dedicated regions 106.

The chips 108 are selected for placement on the host layer 104 (e.g., one of the embodiments of host layer 104A and 104B) from a set of chip types that are designed to work together to perform various functions. In an exemplary embodiment, the chips 108 are manufactured and tested, and a chip designer may select a number of the chips 108 for inclusion in the host layer 104 based upon customized requirements provided, e.g., by a customer or client. In addition, the modular design of the host layer 104 allows the efficient construction of computer processors with various modular components without requiring the disclosure of the operation or construction methods of the modular components. In this way, a manufacturer may securely manufacture computer processors in a restrictive environment such as, for example, in military applications.

As indicated above, chips 108 may be manufactured and tested for subsequent placement in the 3D computer processing chip stack 100. Because the chips 108 may be mounted in the host layer 104 at some future time (e.g., as client or customer requirements dictate), the chips 108 may be manufactured efficiently in large batches, therefore increasing the yield. Since the host layer 104 is configured for varying chip sizes, the chips 108 may be made as small as possible, thereby further increasing the yield and lowering the manufacturing costs. Additionally, further efficiencies may be realized because the chips 108 are designed as independent, stand-alone components. As a result, each chip 108 may be tested individually, and any defective chips may be discarded without sacrificing the remaining components of the 3D processing chip stack 100. This feature further increases the yield of the 3D processing chip stacks 100 by ensuring that all components are working before final assembly of the 3D processing chip stack 100.

Figure 2A:
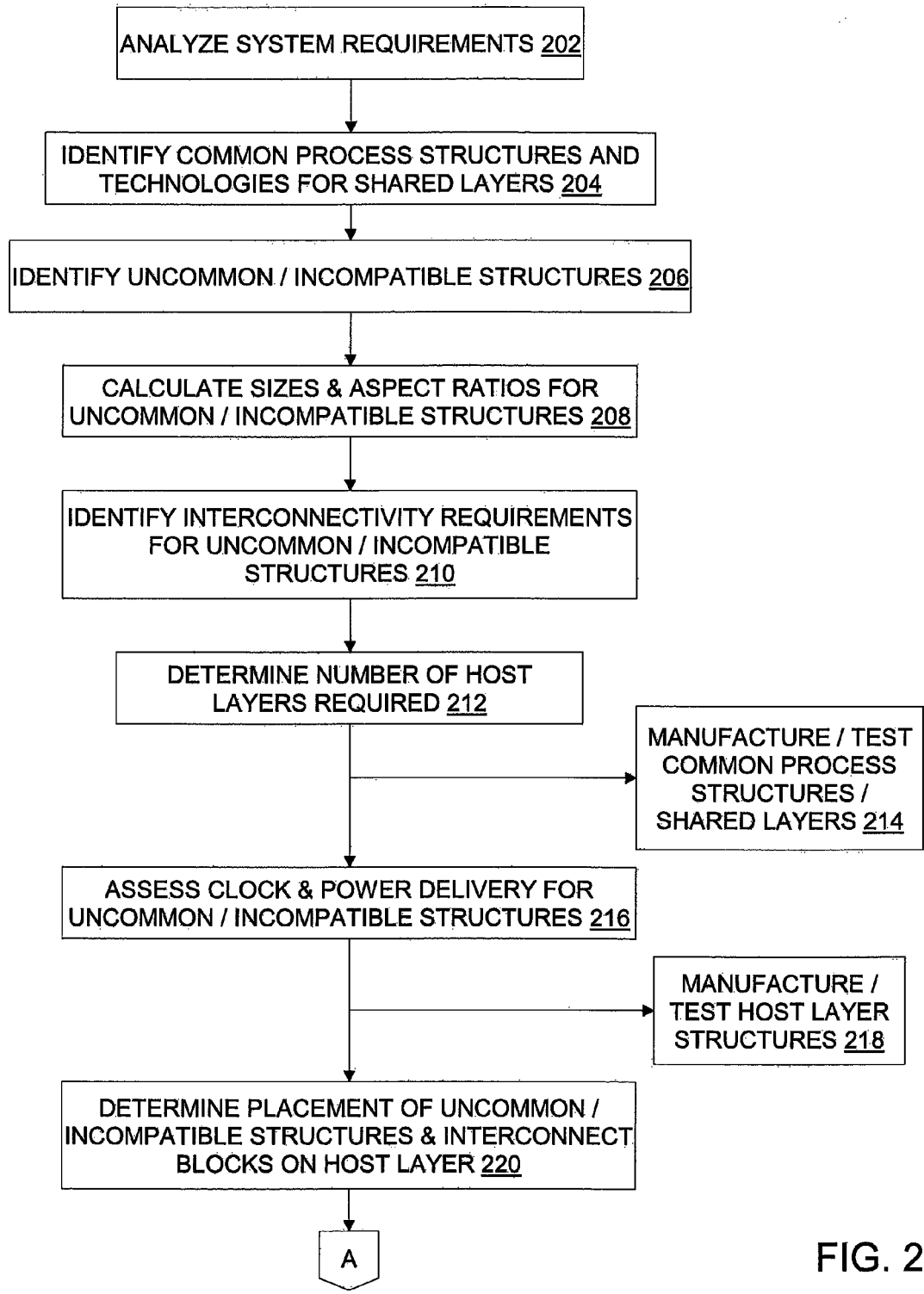
FIGS. 2A-2B depict a flow diagram describing a process for forming a three-dimensional computer processing chip stack in an exemplary embodiment.
Figure 2B:
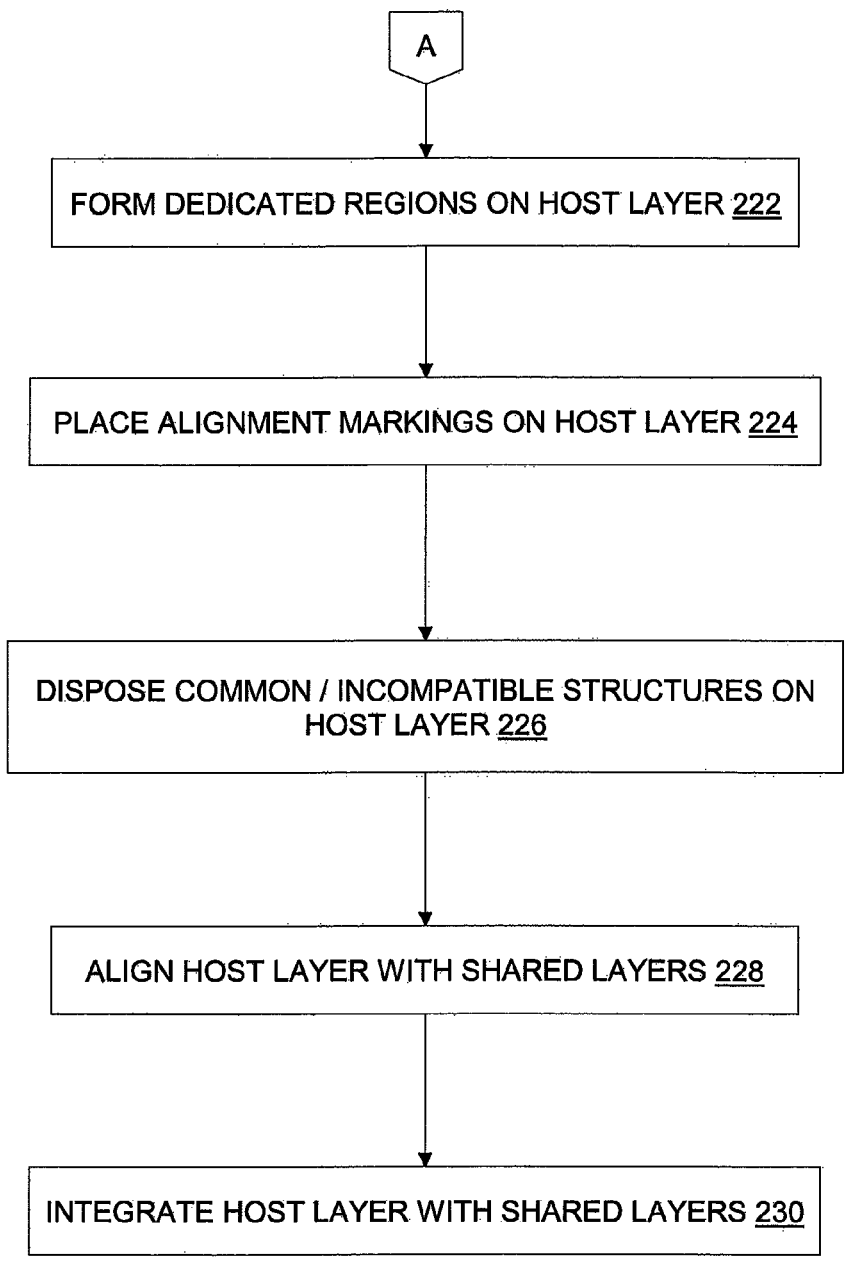
Figure 3:
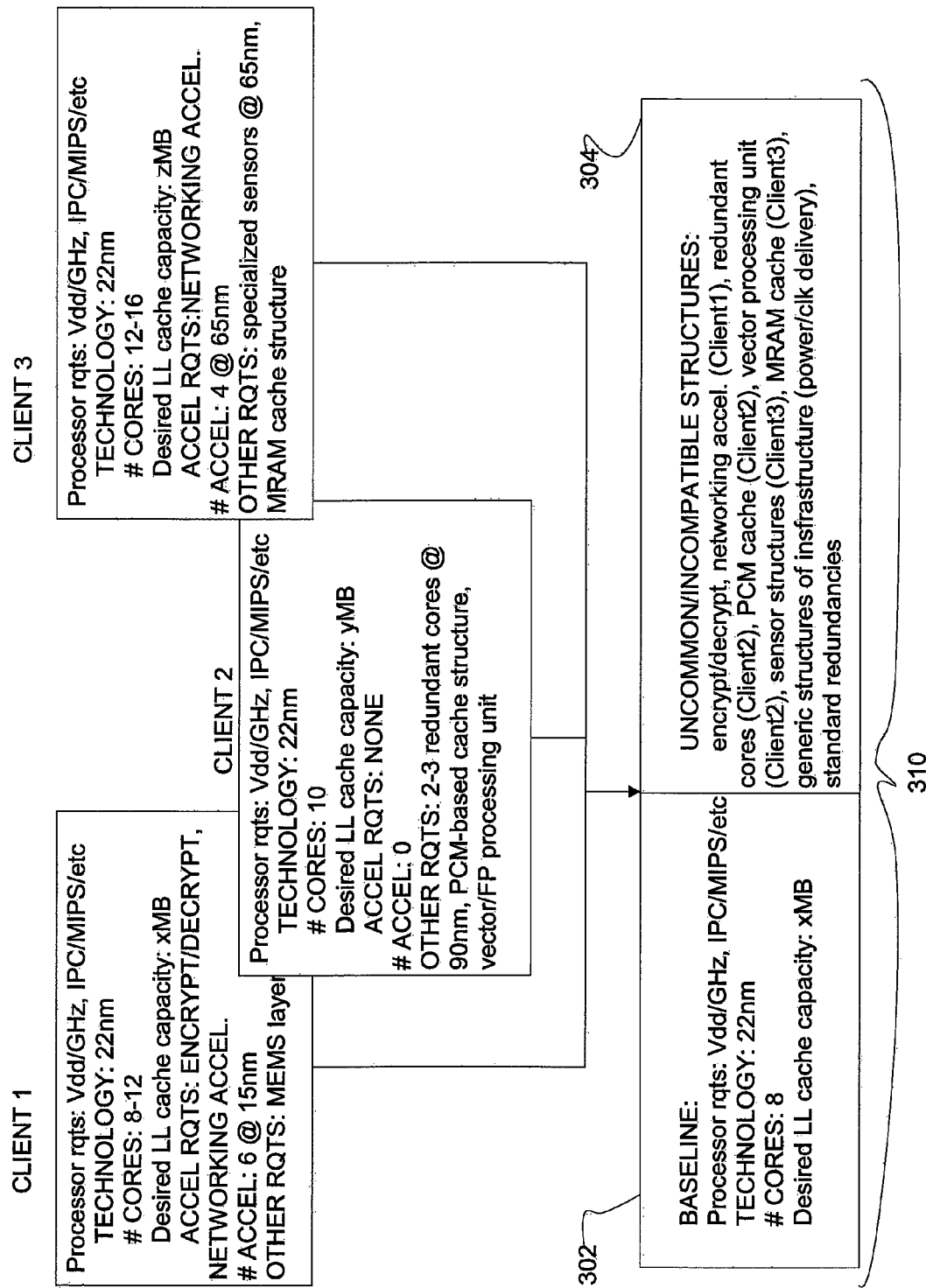
FIG. 3 depicts a block diagram illustrating sample client requirements and a three-dimensional computer processing chip stack plan developed from the client requirements in accordance with an exemplary embodiment.
Figure 4:
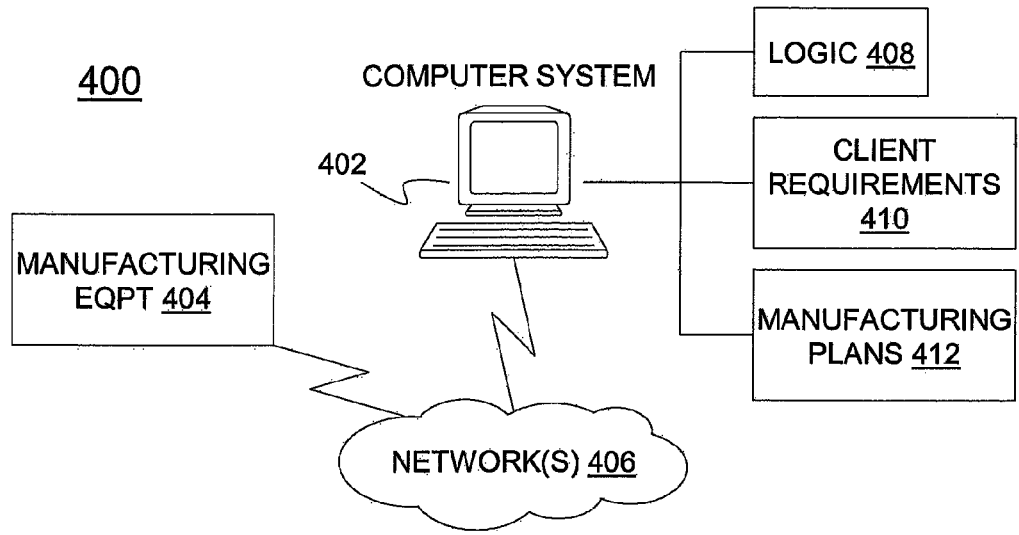
FIG. 4 depicts a block diagram of a system upon which manufacturing and design plans of three-dimensional computer processing chip stacks may be implemented in an exemplary embodiment.
Figure 5:
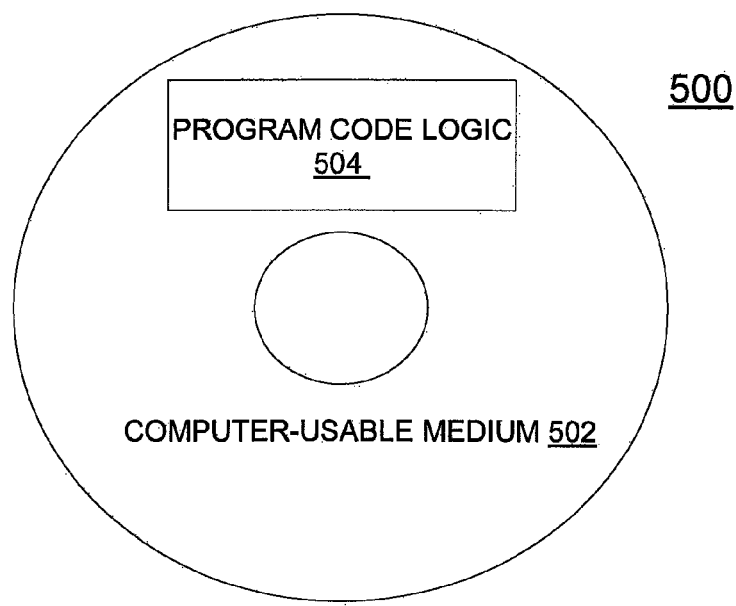
FIG. 5 depicts a computer program product in an exemplary embodiment.

FIGS. 2A-2B illustrate a flow diagram describing a process for forming a three-dimensional computer processing chip stack in an exemplary embodiment, FIG. 3 depicts a block diagram illustrating sample client requirements and a three-dimensional computer processing chip stack plan developed from the client requirements in accordance with an exemplary embodiment, and FIG. 4 depicts a block diagram of a system upon which the manufacturing and planning may be implemented in an exemplary embodiment.

The system 400 of FIG. 4 includes a computer system 402 and manufacturing equipment 404 in communication with one or more networks 406. The computer system 402 may be a general-purpose computer processing device (e.g., a desktop computer) or may be a high-powered system, such as a mainframe computer. The network(s) 406 may comprise any types of networks known in the art, e.g., Internet, local area network, wide area network, or a combination of varying networks. In an alternative embodiment, the manufacturing equipment 404 may be in direct communication with the computer system 402, e.g., via cabling. The manufacturing equipment 404 may include various types of process equipment for manufacturing computer processing chips, including the 3D computer processing chip stack 100 described in FIG. 1. The computer system 402 executes logic 408 for implementing the exemplary processes described herein. The computer system 402 may also execute various applications typically associated with a manufacturing enterprise (e.g., manufacturing enterprise system software, manufacturing resource planning applications, etc. (not shown)). The computer system 402 may also include internal or external memory for storing data used in implementing the exemplary processes described herein. The types of data that may be stored in the computer system memory may include, e.g., client requirements 410 and manufacturing plans 412 (also referred to herein as 3D computer processing chip stack plans), both of which are described further herein. The manufacturing process, three-dimensional computer processing chip stack planning, and system will now be described with respect to FIGS. 2A-2B, FIG. 3, and FIG. 4.

At block 202, system requirements for a number of computer processing devices are received at the computer system 402 and analyzed via the logic 408. For example, as shown in FIG. 3, there are three sets of system requirements for respective Clients 1, 2, and 3. These requirements may be retrieved from storage (e.g., client requirements 410 stored in memory of the computer system 402).

At block 204, the logic 408 identifies any common processing structures and technologies resulting from the analysis. Common structures and technologies refer to components and related technologies for client requirements that are shared among a defined quantity or percentage of clients (e.g., 95-100% of clients require 8 processing cores for a requested product (e.g., stack 100)). These common structures and technologies are also referred to as baseline requirements and are extrapolated from the collective client requirements (e.g., from Clients 1, 2, and 3). The baseline requirements are assigned/reserved for placement on one or more shared layers 110, 112, and 114. As shown in FIG. 3, a common technology shared by all three Clients 1-3 is 22 nm technology. Other examples of baseline requirements are shown in box 302 of FIG. 3.

At block 206, the logic 408 identifies any uncommon and/or incompatible structures from the analysis. Uncommon structures refer to components and technologies for client requirements that are not shared among any of the clients or may be common to a small quantity or percentage of clients. Incompatible structures and technologies refer to components and technologies for the client requirements that are not compatible with any of the common structures of these requirements. Examples of the types of structures/technologies may include, e.g., repair or patch chips, accelerators, encryption/decryption, and redundancies. These uncommon and/or incompatible structures are assigned/reserved for placement on the host layer 104 (i.e., the above-described chips 108 reflect these uncommon and/or incompatible structures or technologies). An example of uncommon and/or incompatible structures and technologies are shown in box 304 of FIG. 3. Together, the data in boxes 302 and 304 form the collective structures and technologies 306 of the system requirements requested from the Clients 1-3.

At block 208, the logic 408 calculates sizes and aspect ratios for uncommon/incompatible structures in box 304. For example, if the chips 108 are manufactured by the same vendor (hence, the vendor has full control over the size/aspect ratios of these chips), the sizing calculations may be implemented to assess the potential chip area utilization and select a configuration that maximizes the amount of area used by the chips 108.

At block 210, the logic 408 identifies interconnectivity requirements for the uncommon and/or incompatible structures in box 304.

At block 212, the logic 408 determines the number of host layers 104 required in order to satisfy the client requirements (e.g., from the uncommon and/or incompatible structure and technology data in box 304). The determination may be made using the aspect ratio calculations, the interconnection requirements, and dimensions of the host layer 104.

At block 214, the logic 408 sends the baseline data in box 302 to the manufacturing equipment 404 (e.g., via network 406), e.g., as one of the manufacturing plans 412, and the manufacturing equipment 404 manufactures the common structures from the baseline data as well as shared layers (e.g., multiple instances of each of layers 110, 112, and 114). The manufacturing process may include providing holes on the layers 110, 112, and 114 for subsequent alignment during the integration process. These structures may also be tested before performing the integration process.

At block 216, the logic 408 assesses clock and power delivery requirements for the uncommon and/or incompatible structures in box 304 (e.g., examining the specifications of the various chips 108 in terms of Vdd, Vcs, Fclk ranges and target levels to determine the compatibility of these values). If the Vdd targets and clock ranges overlap, for example, the items in the blocks 302/304 may be switched in the host layer design plan. Alternatively, one or more of the chips 108 may share or switch clock and voltage delivery infrastructure.

At block 218, the logic 408 sends the uncommon/incompatible structure data in box 304 to the manufacturing equipment 404 (e.g., via network 406), and the manufacturing equipment 404 manufactures the uncommon and/or incompatible structures (e.g., these structures refer to the above-described chips 108). These structures may also be tested before performing the integration process.

At block 220, the logic 408 determines placement of uncommon and/or incompatible structures and interconnect blocks (e.g., wiring) on host layer 104. The placement of the chips 108 may be determined using various analytical techniques. By way of example, factors to consider may include whether a component of a layer is required to overlap with another component in an underlying layer, or whether a component need not overlap with another component but needs to be in proximity of a number of other elements. Additionally, the logic 408 may be configured to exploit the use of a shared element by placing close together multiple chips 108 that share use of the common element.

The logic 408 sends this information to the manufacturing equipment 404 (e.g., via the network 406), and the manufacturing equipment 404 prepares the host layer 104, as will now be described. The host layer 104 is formed of a thermally conductive material, which assists in the dissipation of heat created by the chips 108 on the host layer 104 and components (e.g., the common structures) of the shared layers (e.g., layers 110, 112, and 114) through the thermally conductive material. In an exemplary embodiment, the host layer 104 is configured to protect the chips 108 and the other layers from alpha radiation.

At block 222, dedicated regions 106 are formed on the host layer 104 for receiving chips 108 that are pre-configured with heterogeneous properties. One of the heterogeneous properties includes size variation. Other heterogeneous properties may include variation in thicknesses, aspect ratios, wiring characteristics/number of wiring layers, supply voltage and clock specifications, and the use of disparate technologies. As described above, the disparate technologies may include, e.g., 22 nm, 32 nm, and 45 nm technologies. The dedicated regions 106 (cavities) are formed to accommodate the heterogeneous properties of the chips (e.g., the dedicated regions 106 are formed of a size that corresponds with the sizes of respective chips 108). The dedicated regions 106 may be formed by etching the host layer 104. It will be understood that in exemplary embodiments, the host layer 104 is manufactured separately from the chips 108, and the other layers 110, 112, and 114. In exemplary embodiments, the host layer 104 may be etched to create openings for the chips 108. In additional exemplary embodiments, the host layer 104 may be etched to form etch stops to create borders for the dedicated regions 106.

At block 224, alignment markings 118 are placed on the host layer 104. The alignment markings 118 are configured to align the host layer 104 with the at least one other layer (e.g., one or more of layers 110, 112, and 114). The host layer 104 may be aligned with other layers via a laser beam directed through the host layer 104. The host layer 104 and the other layers (110, 112, 114) are successfully aligned when the laser beam passes through the host layer 104 (via the alignment markings 118) and the alignment holes provided on the other layers.

At block 226, the host layer 104 is further prepared by disposing the chips 108 in corresponding dedicated regions 106 of the host layer 104. As indicated above, each of the chips 108, when disposed on the host layer 104, lacks an electrical and functional connection with the other chips 108 on the host layer 104. Further, as indicated above, the chips 108 disposed on the host layer 104 are joined to respective surfaces of their corresponding dedicated regions 106 through the application of this infrastructure to the host layer 104, thereby forming a monolithic element with respect to the host layer 104 and chips 108. The monolithic aspects provide a smooth seamless surface, as depicted in the exemplary host layer 104 of FIG. 1A.

At block 228, the host layer 104 is aligned with the one or more other layers (e.g., layers 110, 112, and 114), as described above in block 224.

At block 230, the host layer 104 is integrated, or joined, with the other layers (e.g., layers 110, 112, and 114) to form the stack 100.

Technical effects and benefits include a thermally conductive host layer 104 that provides both efficient heat displacement and protection from alpha radiation. In addition, the host layer 104 provides a base layer for placement and alignment of chips 108 via dedicated regions 106 formed on the host layer 104 that allow for the efficient and separate manufacture of heterogeneous chips 108 for a 3D computer processing chip stack 100.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that may communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As described above, embodiments may be embodied in the form of computer-implemented processes and apparatuses for practicing those processes. In exemplary embodiments, the invention is embodied in computer program code executed by one or more network elements. Embodiments include a computer program product 500 on a computer usable medium 502 with computer program code logic 504 containing instructions embodied in tangible media as an article of manufacture. Exemplary articles of manufacture for computer usable medium 502 may include floppy diskettes, CD-ROMs, hard drives, universal serial bus (USB) flash drives, or any other computer-readable storage medium, wherein, when the computer program code logic 504 is loaded into and executed by a computer 402, the computer 402 becomes an apparatus for practicing the invention. Embodiments include computer program code logic, for example, whether stored in a storage medium, loaded into and/or executed by a computer, or transmitted over some transmission medium, such as over electrical wiring or cabling, through fiber optics, or via electromagnetic radiation, wherein, when the computer program code logic is loaded into and executed by a computer, the computer becomes an apparatus for practicing the invention. When implemented on a general-purpose microprocessor, the computer program code logic segments configure the microprocessor to create specific logic circuits.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

The invention claimed is:

1. A method for generating and implementing a three-dimensional (3D) computer processing chip stack plan, the method comprising:
    receiving system requirements from a plurality of clients;
    identifying common processing structures and technologies from the system requirements and assigning the common processing structures and technologies to at least one layer in the 3D computer processing chip stack plan, the common processing structures and technologies specifying properties of processing structures and technologies that are common to a defined quantity of the clients;
    identifying uncommon processing structures and technologies from the system requirements and assigning the uncommon processing structures and technologies to a host layer in the 3D computer processing chip stack plan, the uncommon processing structures and technologies specifying properties of processing structures and technologies that have no commonality with a defined quantity of the clients;
    determining placement and wiring of the uncommon structures on the host layer, and storing placement information in the plan; and
    transmitting the plan to manufacturing equipment, the manufacturing equipment generating both the at least one layer including the common structures and technologies and the host layer including the uncommon structures and technologies, and integrating the host layer and the at least one layer according to assignments and the placement information to form the 3D computer processing chip stack, the 3D computer processing chip stack comprising:
        the host layer including cavities formed thereon for receiving chips pre-configured with heterogeneous properties relative to each other, the cavities formed to accommodate the heterogeneous properties of the chips,
        wherein the chips are joined to respective surfaces of the cavities thereby forming an element having a smooth surface with respect to the host layer and the chips.

2. The method of claim 1, wherein the 3D computer processing chip stack further comprises programmable wiring configured on the element, such that communication is enabled among the chips disposed on the host layer.

3. The method of claim 1, wherein the cavities are formed by etching the host layer.

4. The method of claim 1, wherein the properties include aspect ratio.

5. The method of claim 1, wherein the properties include size.

6. The method of claim 1, wherein the properties include thickness.

7. The method of claim 1, wherein the properties include supply voltage.

8. The method of claim 1, wherein the properties include clock specifications.

9. The method of claim 1, wherein the properties include at least one of type of technology and technology generation.

10. The method of claim 1, wherein the 3D computer processing chip stack further a dedicated power supply and a dedicated clock grid for each of the chips.

11. The method of claim 1, wherein the host layer includes thermally conductive material configured to dissipate heat.

12. The method of claim 1, wherein the host layer includes mesh structures configured to shield the 3D computer processing chip stack from alpha radiation.

13. The method of claim 1, wherein the host layer further includes embedded metal structures configured to dissipate heat.

14. The method of claim 1, wherein the host layer further includes alignment markings configured for aligning the host layer with the at least one layer via a laser beam directed through the host layer, wherein the host layer and the at least one layer are successfully aligned when the laser beam passes through the host layer and alignment holes provided on the at least one layer.

15. The method of claim 1, wherein chips disposed on the host layer of the 3D computer processor chip stack lack an electrical and functional connection with other chips on the host layer.

* * * * *